(12) United States Patent
Menard

(10) Patent No.: US 10,707,337 B2
(45) Date of Patent: Jul. 7, 2020

(54) ONE-WAY SWITCH WITH A GATE REFERENCED TO THE MAIN BACK SIDE ELECTRODE

(71) Applicant: STMicroelectronics (Tours) SAS, Tours (FR)

(72) Inventor: Samuel Menard, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 3 days.

(21) Appl. No.: 16/052,378

(22) Filed: Aug. 1, 2018

(65) Prior Publication Data
US 2019/0043972 A1 Feb. 7, 2019

(30) Foreign Application Priority Data
Aug. 2, 2017 (FR) ...................... 17 57427

(51) Int. Cl.
*H01L 29/74* (2006.01)
*H01L 29/66* (2006.01)
*H01L 29/423* (2006.01)
*H01L 29/06* (2006.01)
*H01L 29/747* (2006.01)
*H01L 29/08* (2006.01)

(52) U.S. Cl.
CPC ........ *H01L 29/747* (2013.01); *H01L 29/0619* (2013.01); *H01L 29/42308* (2013.01); *H01L 29/66386* (2013.01); *H01L 29/7404* (2013.01); *H01L 29/0839* (2013.01)

(58) Field of Classification Search
CPC ............. H01L 29/747; H01L 29/66386; H01L 29/0619; H01L 29/7404; H01L 29/42308; H01L 29/0839
See application file for complete search history.

(56) References Cited

U.S. PATENT DOCUMENTS

| 4,613,884 A | 9/1986 | Angerstein et al. |
| 5,608,235 A | 3/1997 | Pezzani |
| 9,455,253 B2 * | 9/2016 | Menard et al. ..... H01L 27/0817 |
| 2011/0284921 A1 | 11/2011 | Menard |

FOREIGN PATENT DOCUMENTS

| EP | 1076366 A1 | 2/2001 |
| EP | 1524767 A2 | 4/2005 |
| FR | 2535529 A1 | 5/1984 |
| JP | S58134471 A | 8/1983 |

OTHER PUBLICATIONS

INPI Search Report and Written Opinion for FR 1757427 dated Mar. 20, 2018 (8 pages).

* cited by examiner

*Primary Examiner* — Thanhha S Pham
(74) *Attorney, Agent, or Firm* — Crowe & Dunlevy

(57) ABSTRACT

A one-way switch has a gate referenced to a main back side electrode. An N-type substrate includes a P-type anode layer covering a back side and a surrounding P-type wall. First and second P-type wells are formed on the front side of the N-type substrate. An N-type cathode region is located in the first P-type well. An N-type gate region is located in the second P-type well. A gate metallization covers both the N-type gate region and a portion of the second P-type well. The second P-type well is separated from the P-type wall by the N-type substrate except at a location of a P-type strip that is formed in the N-type substrate and connects a portion on one side of the second P-type well to an upper portion of said P-type wall.

21 Claims, 3 Drawing Sheets

ONE-WAY SWITCH WITH A GATE REFERENCED TO THE MAIN BACK SIDE ELECTRODE

PRIORITY CLAIM

This application claims the priority benefit of French Application for Patent No. 1757427, filed on Aug. 2, 2017, the content of which is hereby incorporated by reference in its entirety to the maximum extent allowable by law.

TECHNICAL FIELD

The present disclosure relates to a one-way switch and more particularly to a vertical one-way switch having a gate referenced to the main back side electrode. The present disclosure further relates to the association of such a one-way switch with a thyristor to form a bidirectional switch.

BACKGROUND

FIGS. 1A and 1B are copies of FIGS. 2A and 2B of European Patent No. EP1076366 (incorporated by reference). FIGS. 1A and 1B are a cross-section view and a top view of a monolithic bidirectional switch. Only the left-hand portions of FIGS. 1A and 1B will be discussed, each of these portions being delimited from the right-hand portion by a dotted line D. These left-hand portions correspond to a one-way switch Th1 having its gate referenced to main back side electrode A1.

Switch Th1 comprises a lightly-doped N-type silicon substrate 1. The back side of substrate 1 is covered with a P-type doped layer 2 forming the anode of the switch. An anode metallization M1 covers layer 2 and forms main back side electrode A1. The lateral surfaces of substrate 1 are totally covered with a P-type doped wall 7.

A P-type doped well 4 is formed from the front surface of substrate 1. A heavily N-type doped region 3 is formed in the upper portion of well 4. A cathode metallization M2 covers the upper surface of region 3 and forms the main front side electrode A2.

A P-type doped well 9 is also formed from the upper surface of substrate 1. Well 9 has, in top view, a rectangular shape and is in contact along its entire length and its small sides with P-type wall 7, as shown in FIG. 1B. A heavily-doped N-type gate region 8 is formed in the upper portion of well 9. A metallization M3 covers the upper surface of region 8 and forms gate electrode G. In this type of structure, gate electrode G is referenced to back side electrode A1, which forms the anode of the switch.

Emitter short-circuits may be formed in N-type doped cathode region 3. Similarly, an N-type doped channel stop region may be formed in substrate 1 around well 4. The emitter short-circuits and the channel stop region are not shown in FIGS. 1A and 1B. The operation of this switch is disclosed in detail in patent European Patent No. EP1076366. For the turning-on, while a negative voltage is applied to electrode A2 with respect to electrode A1, a negative voltage is applied to gate G with respect to electrode A1. A gate current $i_b$ flows between the gate and the anode and turns on an auxiliary thyristor Tha, formed by layer 2, substrate 1, well 9, and region 8. Thyristor Tha then conducts a current $i_c$ and turns on switch Th1. A current $I_{Th1}$ then runs through switch Th1.

It would be desirable to be able to at least partly improve certain aspects of known bidirectional switches, and in particular their dV/dt behavior.

SUMMARY

Thus, an embodiment provides a one-way switch with an improved dV/dt behavior.

Another embodiment provides a bidirectional switch with an improved dV/dt behavior.

More particularly, a one-way switch having its gate referenced to the main back side electrode comprises: an N-type substrate; a P-type anode layer covering the back side; a P-type wall surrounding the lateral surfaces of the substrate; first and second P-type wells formed on the front side of the substrate; an N-type cathode region formed in the first well; an N-type gate region formed in the second well; a gate metallization covering the N-type gate region and a portion of the second P-type well; and a P-type strip formed in the substrate and connecting a portion on one side of the second well to an upper portion of said wall.

According to an embodiment, the N-type gate region has, in top view, a rectangular shape comprising a notch at the edge of its central portion on the side of the anode region.

According to an embodiment, said strip has a width in the range from 10 to 50% of the length on the side of the second well connected to the strip.

According to an embodiment, the N-type cathode region is crossed by emitter short-circuits.

Another embodiment provides a bidirectional switch comprising a cathode gate thyristor chip and a one-way switch chip such as hereabove, wherein: the gates of the thyristor and of the one-way switch (ACS) are connected; the cathode of the one-way switch and the anode of the thyristor are connected; and the anode of the one-way switch and the cathode of the thyristor are connected to a reference electrode.

BRIEF DESCRIPTION OF THE DRAWINGS

The foregoing and other features and advantages will be discussed in detail in the following non-limiting description of dedicated embodiments in connection with the accompanying drawings, wherein.

DETAILED DESCRIPTION

Figure 1A:
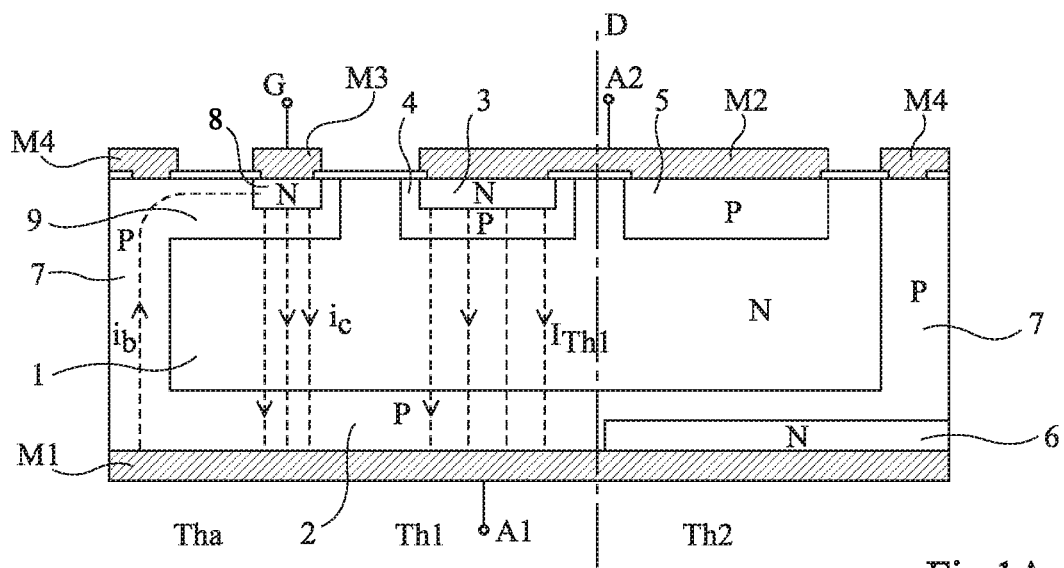
FIGS. 1A and 1B, previously described, are copies of FIGS. 2A and 2B of European Patent No. EP1076366.

The same elements have been designated with the same reference numerals in the various drawings and, further, the various drawings are not to scale. For clarity, only those steps and elements which are useful to the understanding of the described embodiments have been shown and are detailed.

In the following description, when reference is made to terms qualifying the absolute position, such as terms "front", "back", "left-hand", "right-hand", or the relative position, such as terms "top" and "upper", reference is made to the orientation of the drawings. Unless otherwise specified, expression "in the order of" means to within 10%, preferably to within 5%.

Figure 2A:
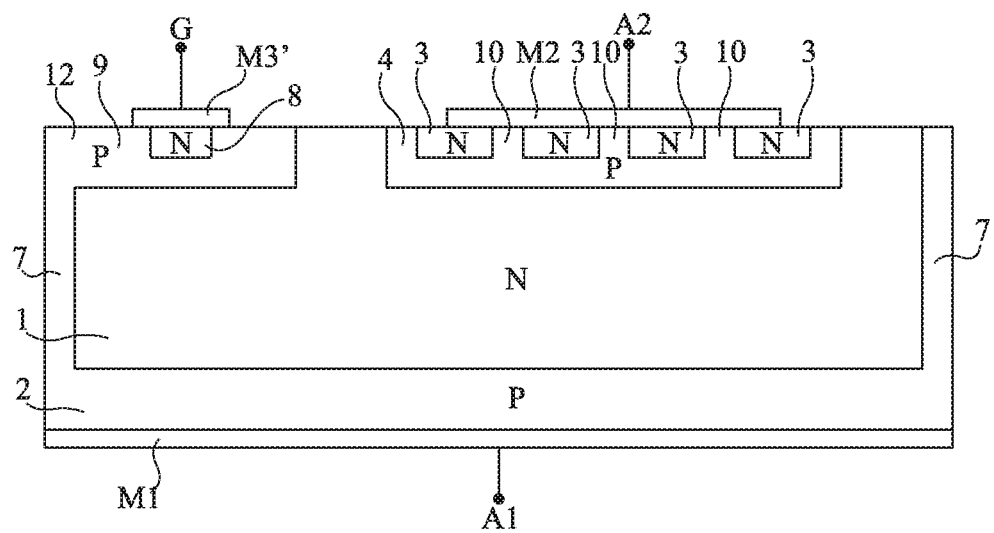
FIGS. 2A and 2B are a cross-section view and a top view of an embodiment of a one-way switch having a gate referenced to the main back side electrode.
Figure 2B:
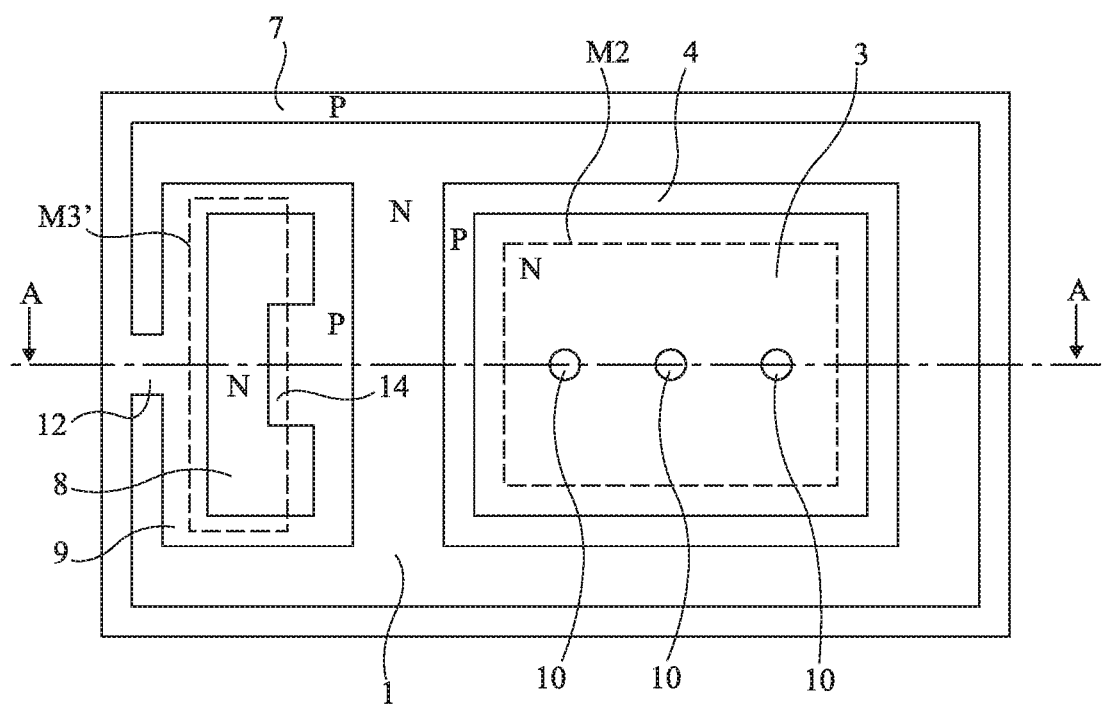

FIGS. 2A and 2B are a cross-section view and a top view of an embodiment of a one-way switch having a gate G referenced to back side electrode A1. FIG. 2A is a cross-section view along line AA of FIG. 2B. The shape of the metallizations present on the front side is designated with dotted lines in FIG. 2B.

Figure 1B:
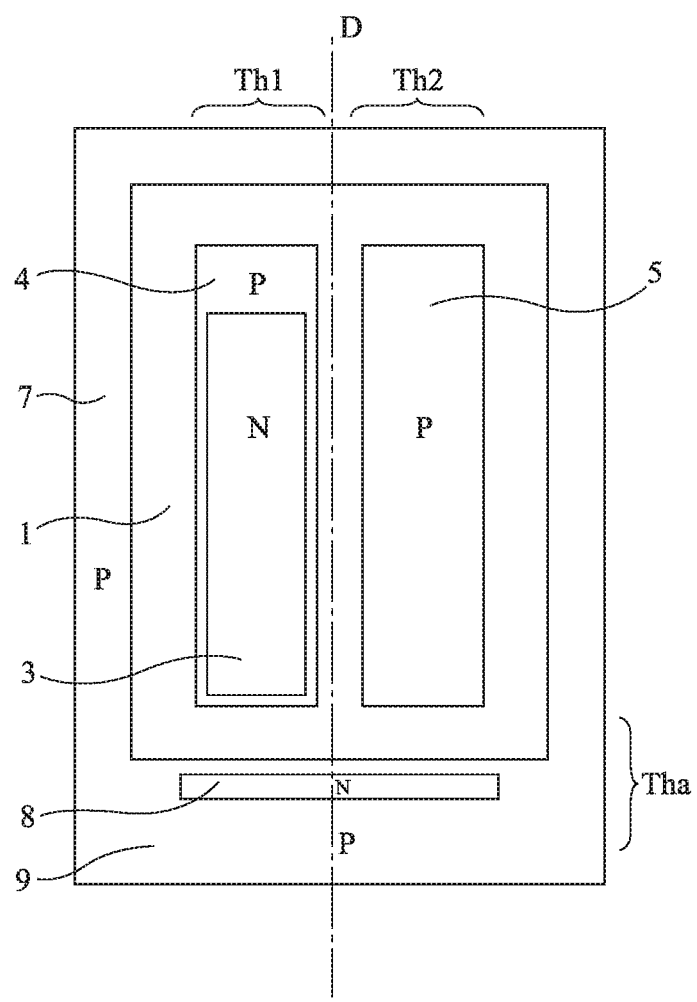

FIGS. 2A and 2B show structures similar to those of the left-hand portions of FIGS. 1A and 1B. The same elements as in FIG. 1 are designated with the same reference numerals in FIGS. 2A and 2B. The drawings show N-type doped substrate 1 having its back side covered with a P-type doped anode layer 2 and having its lateral surfaces covered with a P-type doped wall 7. N-type doped cathode region 3 is here again formed at the front surface, in P-type doped well 4, which is itself formed in substrate 1. Gate region 8 is formed at the front surface, in P-type doped well 9.

In this embodiment, emitter short-circuits 10 are shown in cathode well 3. Emitter short-circuits 10 connect metallization M2 to well 4 through region 3.

A difference between the switch of FIGS. 1A and 1B and the present embodiment is that, in FIGS. 1A and 1B, the gate metallization only covers N-type doped gate region 8 while, in FIGS. 2A and 2B, the gate metallization, designated with reference M3', partly covers P-type doped well 9. An advantage of this difference is to desensitize the gate contact, that is, to make the switch less sensitive to parasitic dV/dt turning on.

As illustrated in FIG. 2B, another difference is that well 9 is not connected to wall 7 along its entire length and by its small sides. Well 9 is only connected to wall 7 by a P-type doped strip 12. Strip 12 is in contact with a portion of well 9 having a length in the range from 10 to 50% of the total length of well 9. Such a structure enables to decrease the electric resistance between the gate metallization and the back side metallization. In a switch of the type in FIG. 1, such a resistance is, for example, in the order of 1 MΩ while that of the present embodiment is for example in the range from 100 to 300 Ω. The resistance being lower, the turning-on of the switch requires a gate voltage stronger than that of a switch of the type in FIG. 1. The gate contact is then less sensitive to voltage variations (dV/dt).

N-type region 8 has a generally rectangular shape. A notch 14 is for example formed on the side of region 8 opposite to the connection by strip 12 between well 9 and wall 7. In the case of FIG. 2B, gate metallization M3' has a rectangular shape. Gate metallization M3' partly covers region 8 and partly covers well 9. More particularly, the rightmost ends in FIG. 2B of region 8 are not covered with metallization M3'. Further, the gate metallization extends on well 9 on the left-hand side and into the notch of region 8. This specific shape of region 8 takes part in desensitizing the gate while easing the turning-on of the structure.

Thus, the one-way switch of FIGS. 2A and 2B has a better resistance to parasitic dV/dt turning-on since the gate contact is less sensitive.

In practice, a heavily-doped N-type channel stop region surrounds well 4 but is not shown herein.

Figure 3:
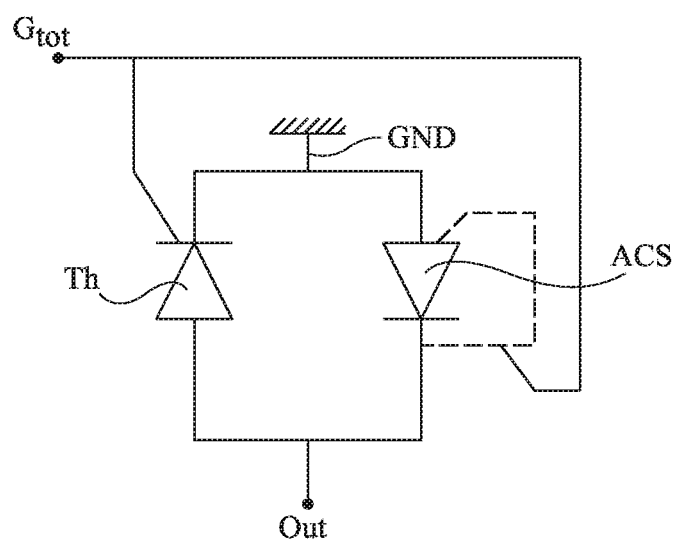
FIG. 3 shows an electronic circuit of an embodiment of a bidirectional switch.

FIG. 3 is an electric diagram of a bidirectional switch using, in the form of two discrete elements, a one-way ACS switch of the type in FIGS. 2A and 2B, and a cathode gate thyristor Th.

The one-way ACS switch is shown by a symbol of the type of that of a conventional thyristor, with the difference that the gate contact arranged on the cathode side (A2) is connected by dotted lines to the anode (A1). This symbol reflects the structure of the switch of FIGS. 2A and 2B where gate region 8 is connected to anode layer 2 of the switch by wall 7. Gate region 8 is located on the cathode side (A2), on the front side of the switch.

The ACS switch and thyristor Th are connected in antiparallel between a reference terminal GND, for example, the ground, and an output terminal Out. Thus, the anode of the ACS switch and the cathode of thyristor Th are connected to reference terminal GND, and the cathode of the ACS switch and the thyristor anode are connected to output terminal Out. Further, the gates of the ACS switch and of thyristor Th are connected and form gate $G_{tot}$ of the bidirectional switch.

The operation of the bidirectional switch will now be described.

When output terminal Out is positive with respect to reference terminal GND, thyristor Th is capable of turning on and the ACS switch is turned off. Applying to gate $G_{tot}$ a voltage positive with respect to the voltage on reference terminal GND turns on thyristor Th. It should be noted that, according to its structure, conventional thyristor Th may also be controlled by a gate voltage negative with respect to the voltage of the reference terminal.

When output terminal Out is negative with respect to reference terminal GND, thyristor Th is turned off and the ACS switch is capable of turning on. Applying to gate $G_{tot}$ a voltage negative with respect to that of reference terminal GND turns on the ACS switch.

When a positive overvoltage (dV/dt) reaches output terminal Out, thyristor Th is capable of turning on due to the turning on of a parasitic thyristor existing in the structure of the ACS switch, illustrated in FIGS. 2A and 2B. Such a parasitic thyristor is formed between electrodes A2 and G, by emitter short-circuit 10 and P-type well 4, N-type substrate 1, P-type well 9, and N-type region 8. This parasitic thyristor is thus connected in FIG. 3 between output terminal Out and gate $G_{tot}$. However, the parasitic thyristor of the switch of FIGS. 2A and 2B is little sensitive to overvoltages due to the presence of the short-circuit, created by metallization M3', between N-type region 8 and P-type well 9. Thus, the parasitic thyristor does not turn on in case of an overvoltage and the bidirectional switch has a good dV/dt behavior.

However, it should be noted that the above-described parasitic thyristor exists in most known one-way switch structures, it then generally has a much higher sensitivity. Considering, for example, one-way switch Th1 disclosed in relation with the left-hand portions of FIGS. 1A and 1B, the parasitic thyristor is present between electrodes A2 and G as in FIGS. 2A and 2B. The parasitic thyristor is sensitive since metallization M3 forms no short-circuit between well 9 and region 8.

An advantage of the bidirectional switch of FIG. 3 is that it is formed of a thyristor and of a one-way switch formed on two different integrated circuit chips and that none of these two chips requires implementing a back side photolithography step. This enables, in particular, to form the components on silicon wafers having a diameter greater than 6 inches (that is, 15.24 cm), for example, in the order of 8 inches (that is, 20.32 cm), for which the photolithography equipment is not adapted to applying treatments on both sides of the wafer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A one-way switch having a gate referenced to a main back side electrode, comprising:

an N-type substrate;
a P-type anode layer covering a back side of the N-type substrate;
a P-type wall surrounding lateral surfaces of the N-type substrate;
first and second P-type wells formed on the front side of the N-type substrate;
an N-type cathode region formed in the first P-type well;
an N-type gate region formed in the second P-type well;
a gate metallization that is in contact with and covers the N-type gate region and further in contact with and covering a portion of the second P-type well; and
a P-type strip formed in the N-type substrate and connecting a portion on one side of the second P-type well to an upper portion of said P-type wall.

2. The switch of claim 1, wherein the N-type gate region has, in top view, a rectangular shape comprising a notch along a first edge at a central portion on a side adjacent the N-type cathode region.

3. The switch of claim 2, wherein the second P-type well is present within the notch.

4. The switch of claim 3, wherein the gate metallization is in contact with and covers a first portion of the N-type gate region and is in contact with and covers said portion of the second P-type well which is present in the notch.

5. The switch of claim 4, wherein the gate metallization is in contact with and covers a further portion of the second P-type well adjacent a second edge of the N-type gate region on a side opposite the notch and adjacent the P-type strip.

6. The switch of claim 1, wherein said P-type strip has a width in the range from 10 to 50% of a length of a side of the second P-type well connected to the P-type strip.

7. The switch of claim 1, wherein the N-type cathode region is crossed by emitter short-circuits.

8. A bidirectional switch, comprising:
a first integrated circuit chip including a cathode gate thyristor; and
a second integrated circuit chip including a one-way switch having a gate referenced to a main back side electrode;
wherein the one-way switch comprises:
an N-type substrate;
a P-type anode layer covering a back side of the N-type substrate;
a P-type wall surrounding lateral surfaces of the N-type substrate;
first and second P-type wells formed on the front side of the N-type substrate;
an N-type cathode region formed in the first P-type well;
an N-type gate region formed in the second P-type well;
a gate metallization that is in contact with and covers the N-type gate region and is in contact with and covers a portion of the second P-type well; and
a P-type strip formed in the N-type substrate and connecting a portion on one side of the second P-type well to an upper portion of said P-type wall;
wherein a gate of the thyristor is connected to the gate metallization of the one-way switch;
wherein an anode of the thyristor is connected to N-type cathode region of the one-way switch; and
wherein a cathode of the thyristor is connected to the P-type anode layer of the one-way switch.

9. The switch of claim 8, wherein the N-type gate region has, in top view, a rectangular shape comprising a notch along a first edge at a central portion on a side adjacent the N-type cathode region.

10. The switch of claim 9, wherein the second P-type well is present within the notch.

11. The switch of claim 10, wherein the gate metallization is in contact with and covers a first portion of the N-type gate region and is in contact with and covers said portion of the second P-type well which is present in the notch.

12. The switch of claim 11, wherein the gate metallization is in contact with and covers a further portion of the second P-type well adjacent a second edge of the N-type gate region on a side opposite the notch and adjacent the P-type strip.

13. The switch of claim 8, wherein said P-type strip has a width in the range from 10 to 50% of a length of a side of the second P-type well connected to the P-type strip.

14. The switch of claim 8, wherein the N-type cathode region is crossed by emitter short-circuits.

15. A one-way switch having a gate referenced to a main back side electrode, comprising:
an N-type substrate;
a P-type anode layer covering a back side of the N-type substrate;
a P-type wall surrounding lateral surfaces of the N-type substrate;
a first P-type well formed on the front side of the N-type substrate;
an N-type cathode region formed in the first P-type well;
a second P-type well formed on the front side of the N-type substrate;
an N-type gate region formed in the second P-type well; and
a gate metallization that is in contact with and covers the N-type gate region and is in contact with and covers a portion of the second P-type well.

16. The switch of claim 15, wherein the N-type gate region has, in top view, a rectangular shape comprising a notch along an edge, said portion of the second P-type well extending into said notch.

17. The switch of claim 16, wherein said edge including said notch faces toward the first P-type well.

18. The switch of claim 16, wherein the rectangular shape of said N-type gate region further comprises a further edge, at an opposite side of the N-type gate region from said edge.

19. The switch of claim 18, wherein said gate metallization is in contact with and covers the N-type gate region further is in contact with and covers a further portion of the second P-type well adjacent said further edge.

20. The switch of claim 19, further comprising a P-type strip formed in the N-type substrate which connects said further portion of the second P-type well to an upper portion of said P-type wall.

21. The switch of claim 20, wherein said N-type substrate separates said second P-type well from said P-type wall except at a location of said P-type strip.

* * * * *